(12) United States Patent
Shinkai et al.

(10) Patent No.: US 6,836,490 B2
(45) Date of Patent: Dec. 28, 2004

(54) OPTICAL MODULE

(75) Inventors: Jiro Shinkai, Kanagawa (JP); Takashi Kato, Kanagawa (JP); Toshio Takagi, Kanagawa (JP); Hiroyuki Yabe, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/247,816

(22) Filed: Sep. 20, 2002

(65) Prior Publication Data

US 2003/0053499 A1 Mar. 20, 2003

(30) Foreign Application Priority Data

Sep. 20, 2001 (JP) ........................................ 2001-287778

(51) Int. Cl.[7] ............................................... H01S 3/04
(52) U.S. Cl. ........................................... 372/36; 372/32
(58) Field of Search ............................ 372/18, 32, 44, 372/46, 36, 40; 385/93

(56) References Cited

U.S. PATENT DOCUMENTS

| | | | | |
|---|---|---|---|---|
| 5,825,792 A | * | 10/1998 | Villeneuve et al. | ............ 372/32 |
| 6,046,813 A | * | 4/2000 | Naganuma | ................... 356/416 |
| 6,151,114 A | * | 11/2000 | Russell | ........................ 356/519 |
| 6,345,060 B1 | * | 2/2002 | Copner et al. | ................. 372/32 |
| 6,366,592 B1 | * | 4/2002 | Flanders | ........................ 372/18 |
| 6,488,419 B2 | * | 12/2002 | Kato et al. | ..................... 385/93 |
| 6,526,079 B1 | * | 2/2003 | Watterson et al. | ............. 372/32 |
| 2001/0022793 A1 | | 9/2001 | Yokoyama | |
| 2002/0018627 A1 | * | 2/2002 | Kato et al. | ..................... 385/93 |
| 2002/0048299 A1 | * | 4/2002 | Hyuga et al. | .................. 372/40 |

FOREIGN PATENT DOCUMENTS

| | | | | |
|---|---|---|---|---|
| JP | 2000-315833 | * | 11/2000 | ............. H01S/3/16 |
| JP | 2001-284711 | | 10/2001 | |
| WO | WO 95/20144 | | 7/1995 | |

* cited by examiner

*Primary Examiner*—Don Wong
*Assistant Examiner*—Hung Tran Vy
(74) *Attorney, Agent, or Firm*—Smith, Gambrell & Russell, LLP

(57) ABSTRACT

The object of the present invention is to provide an optical module for a WDM communication system, in which the oscillation wavelength is on the grid of the WDM regulation. The optical output power and the oscillation wavelength can be controlled independently. The present module includes a semiconductor light-emitting device, a wedge shaped etalon device and two light-receiving devices. The etalon contains a second portion, on which anti-reflection films are coated, and a first portion. One of the receiving devices detects light transmitted through the second portion of the etalon, while the other device detects light through the first portion. A signal from the former device controls the output power of the light-emitting device, while a signal from the latter receiving device controls the oscillation wavelength of the laser.

12 Claims, 10 Drawing Sheets

OPTICAL MODULE

CROSS REFERENCE RELATED APPLICATIONS

This application contains subject matter that is related to the subject matter of the following application, which is assigned to the same assignee as this application and filed on the same day as this application. The below listed application is hereby incorporated herein by reference in its entirely:
"Light-Emitting Module" by Yabe et. al.
"Optical Module" by Takagi et. al.

BACKGROUND OF THE INVENTION

1. Field of Invention

This invention relates to an optical module, especially relates to an optical signal source used in a WDM (Wavelength Division Multiplexing) communication.

2. Related Prior Art

In the WDM communication, the wavelength interval to the adjacent channel is defined to be 0.8 nm. This regulation means that the absolute accuracy superior than ±0.1 nm is required for the signal wavelength of respective channel. A semiconductor laser, such as DFB laser (Distributed Feedback Laser) and DBR (Distributed Bragg Reflector), is utilized for the signal source of the WDM system.

These feedback lasers have a sharp oscillation spectrum with a typical bandwidth less than 50 GHz. However, since the Bragg grating formed within a laser chip solely determines the oscillation wavelength, it would be quite difficult to get the desired wavelength due to the uncertainty of the manufacturing process parameter.

It is also known that the oscillation wavelength of individual lasers can be adjusted by the feedback control after the completion of the production. The method is: 1) dividing the output light from the optical module, 2) monitoring the divided light with a spectrum analyzer, and 3) adjusting the temperature of the laser and the injection current to the laser, thus controlling the oscillation wavelength. However, this technique uses the optical spectrum analyzer and is quite impossible to apply to the WDM system, which requires a plurality set of such large-scale equipment for respective optical signal source.

Another example is disclosed in U.S. Pat. No. 5,825,792, in which a parallel plates etalon is used for the controlling of the oscillation wavelength. In the '792 patent, two optical detectors monitor a divergent light emitted from the back facet of the laser through the etalon placed with an angle for the light. By feed backing the differential signal of two detectors to a temperature of the laser, the oscillation wavelength is effectively adjusted. This method realizes the precisely controlled oscillation wavelength, but requires a precise adjustment of the rotational angle of the etalon to the divergent light beam of the laser.

SUMMARY OF THE INVENTION

The object of the present invention is to provide a light-emitting module that enables to control both of the oscillation wavelength and the optical output power with high accuracy within a compact sized housing.

A light-emitting module according to the present invention comprises a second optical detector for monitoring a light from the semiconductor laser not through an etalon and a first optical detector for monitoring light from the laser through the etalon. The light through the etalon reflects optical properties both of the laser and the etalon, while the light not through the etalon merely shows the properties of the laser. The optical property of the etalon depends on a thickness and shows the transmittance with a periodicity.

Another aspect of the invention is that the etalon has a second portion on which an anti-reflection film is coated and a second portion. Light transmitted through the second portion does not show a periodic behavior based on the thickness of the etalon and merely reflects the characteristic of the laser. On the other hand, light through the first portion on which any anti-reflection film is provided has periodic characteristics reflecting the etalon and the laser.

The fluctuation of the oscillation wavelength of the laser appears as a phase shift of the periodic characteristic of light transmitted through the etalon. Therefore, by monitoring light through the etalon, the just present oscillation wavelength is detected and by monitoring light not through the etalon, the present power of the laser is obtained.

In the invention, it is preferable to split light from the laser before the etalon and to detect split light for monitor light not through the etalon. The light splitting device can locate either in the front side of the laser or the backside of the laser.

It is further preferable to place a lens between the laser and the etalon device for converting divergent light from the laser into a collimated light. Moreover, by using a wedge shape etalon, the oscillating wavelength of the laser can be selected merely sliding the etalon along a direction normal to the optical axis.

The present invention provides a thermoelectric cooler for adjusting temperature of the laser. The temperature is controlled by the signal from the detector that monitors light through the etalon, thus defines the oscillation wavelength.

The invention may also provide an adjusting circuit of the output optical power of the laser.

The signal from the detector that monitors light not through the etalon can maintains the output power of the laser.

DETAILED DESCRIPTION OF THE INVENTION

The preferred embodiments of the optical module will be described in referring to drawings. In the description, elements identical to each other will be referred to with numerals identical to each other without their overlapping explanations.

Figure 1:
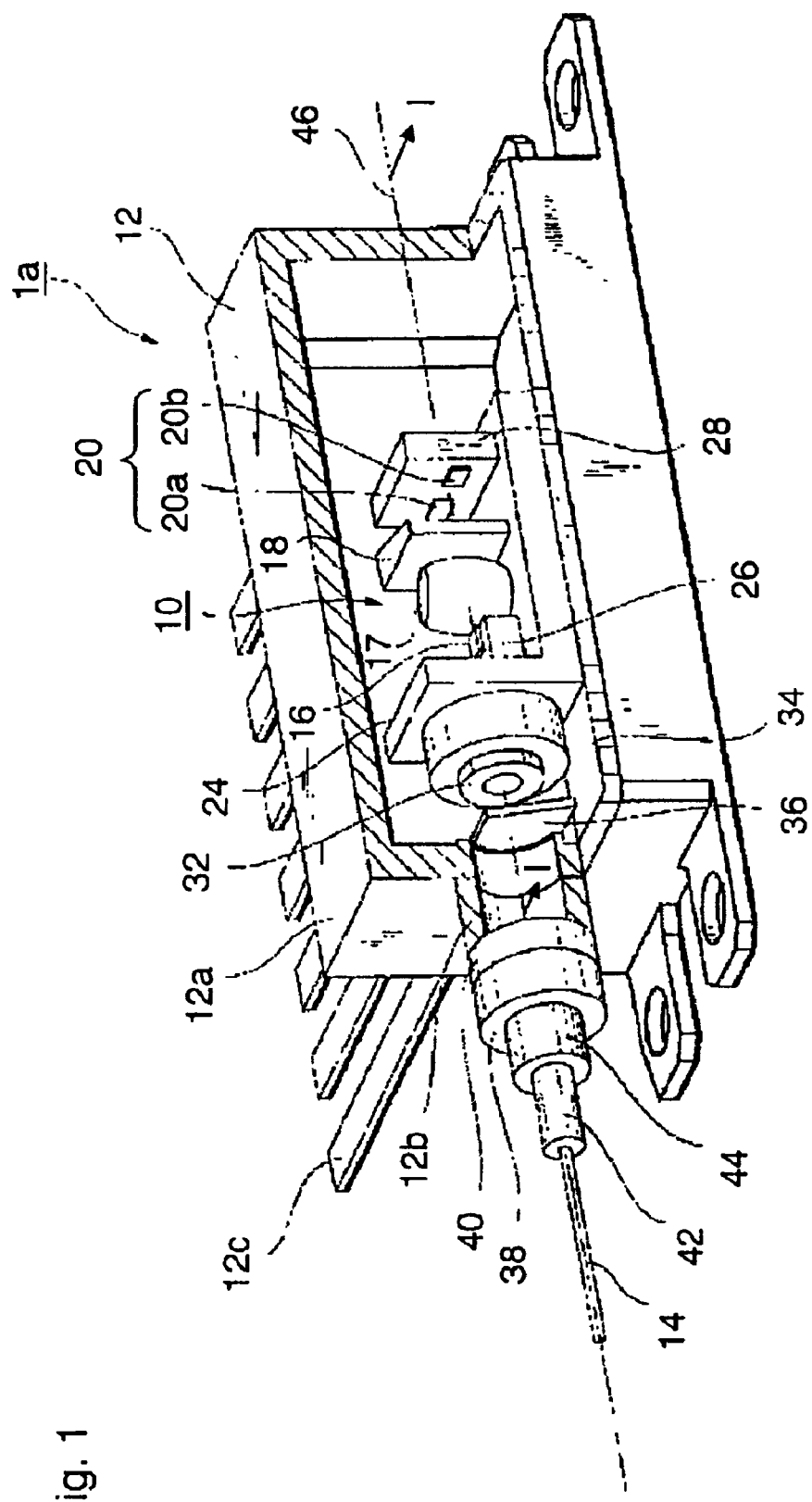
FIG. 1 is a perspective view showing the module.
Figure 2:
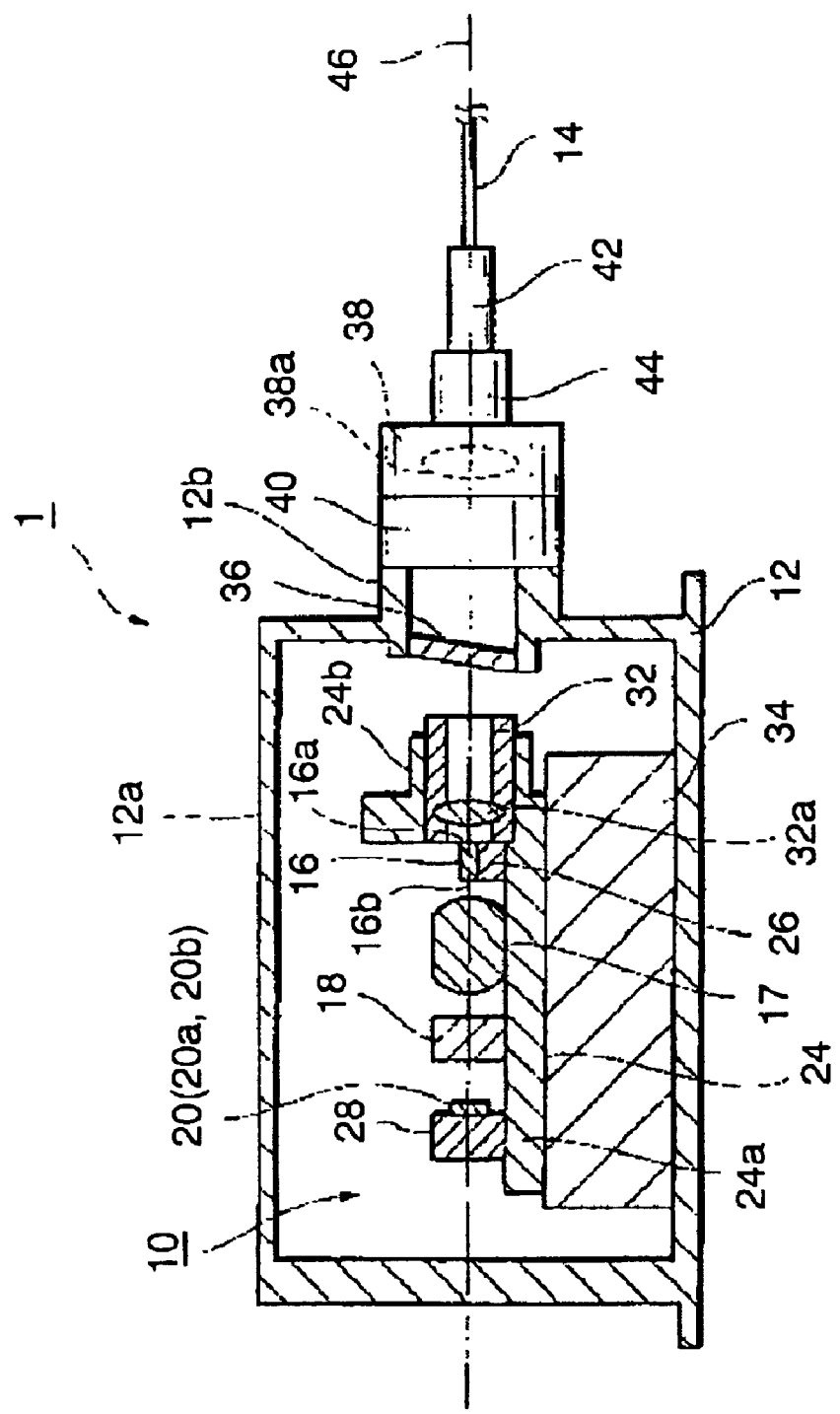
FIG. 2 is a cross sectional view showing the primary assembly of the module.

FIG. 1 is a perspective view showing the laser module of the present invention and FIG. 2 is a cross sectional viewing of the module.

The module comprises a primary assembly 10 and housing 12 containing the assembly 10 therein. The primary assembly 10 is placed on the base plate of the housing and sealed with an inert gas such as dry nitrogen in the housing. The housing 12 comprises a body 12a, a cylinder 12b guiding an optical fiber into the primary assembly and a plurality of leads 12c.

The primary assembly 10 contains a laser diode 16, auxiliary members 24, 26, 28 and a lens holder 32. Auxiliary members 24, 26, 28 mount the laser diode 16, a photo diode 18, and a lens 21, respectively. The auxiliary member 24 is placed on a thermoelectric cooler 34. The cooler 34 enables to control the temperature of the laser diode 16 by adjusting a supply current to the cooler. A Peltier element is a typical device for the cooler 34. The auxiliary member is made of material having a good thermal conductivity, such as Aluminum Nitride (AlN).

An opening sealed by a hermetic glass for coupling the primary assembly to the cylinder 12b is provided on one wall of the housing 12. Light emitted from the laser diode 16 is passing through the opening and entering one tip of an optical fiber 14. Another lens holder 38 is held at the edge of the cylinder 12b. An optical isolator 40 cutting the light propagating form the optical fiber 14 to the laser diode 16 is provided between the lens holder 38 and the cylinder 12b.

The optical fiber 14 is inserted at the edge of the cylinder 12b. A ferrule 42 covers the tips of the fiber 14. The lens holder 38 holds a sleeve 44. Inserting the ferrule 42 into the sleeve 44, the optical position of the ferrule to the housing 12 is defined. Thus, the fiber 14, the lens holder 38 and the primary assembly 10 are optically aligned with each other.

Referring to FIG. 2, the auxiliary member 24 comprises a device-mounting portion 24a and a lens-supporting portion 24b. The lens-supporting portion 24a provides an opening to secure the lens holder 32, in which a lens 32a to collimate light emitted from the laser diode 16 is inserted.

The laser diode 16 comprises a first facet 16a, a second facet 16b, and an active layer (a light-emitting layer) provided between the first and the second facet. The laser is placed on the auxiliary member 26. A pair of facet 16a and 16b of the laser 16 forms an optical cavity. Since the reflectivity of the first facet 16a is lower than that of the second facet 16b, it is enables to take out the light through the first facet 16a. The first facet 16a couples to the optical fiber 14 through lenses 32a and 38a. It is preferable to use the DFB laser (Distributed Feedback Laser) for the light-emitting device 16. However, a Fabry-Perott type laser is also applicable. On the first facet of the laser provides an anti-reflection coating, while a high-reflection coating is preferred to be on the second facet. A SiN (Silicon Nitride) and amorphous Si are used as coating materials.

An etalon device 18 is placed on the auxiliary member 24. One surface of the etalon optically couples to the facet 16b of the laser, while the other surface of the etalon couples to the photo diode 20, which contains a first light detector 20a and a second light detector 20b.

Figure 3A:
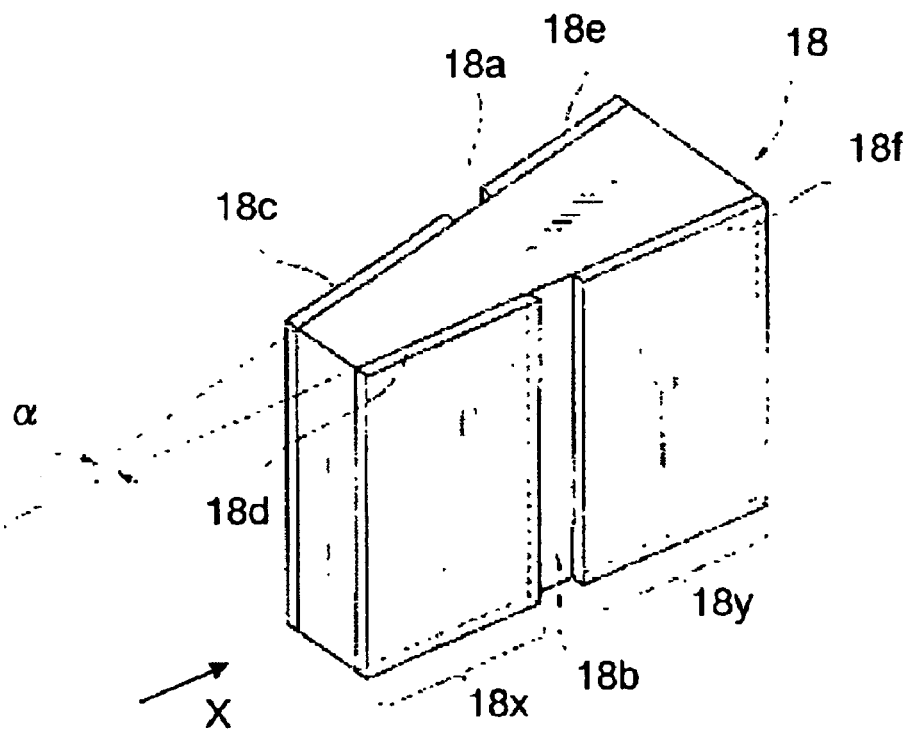
FIG. 3(*a*) and FIG. 3(*b*) show examples of the wedge etalon device.

Next is an explanation of the etalon device as referring FIG. 3. As shown in FIG. 3, etalons (18, 19) have a pair of surface making an angle α with each other. The angle α is preferable to be greater than 0.01° and smaller than 0.1°. Etalons shown in FIG. 3 are wedge type etalon. Only by sliding the wedge etalon along the direction X, to which the surface is inclined, the locking wavelength of the laser module is adjusted. The wedge etalon is usable compared to the parallel plate etalon in this point of view.

In FIG. 3, the etalon 18 comprises a light-entering surface 18a and a light-emitting surface 18b. The angle α between two surfaces is set so as to make multiple interference between the incident light from the surface 18a and the reflected light from the surface 18b. In another aspect, the etalon 18 comprises a first portion 18x and a second portion 18y. The first portion has a reflective film 18c on the light-entering surface 18a and another reflective film 18d on the light-emitting surface. Also, the second portion 18y has anti-reflective films 18e and 18f on the light-entering surface 18a and the light-emitting surface 18b, respectively. The films 18e and 18f on the second portion 18y suppress the reflection at both surfaces so that the periodicity on the transmission spectrum due to multiple reflection at the surface of the etalon disappears. Films (18c to 18f) on the surface are composed of multi layered materials.

Figure 3B:
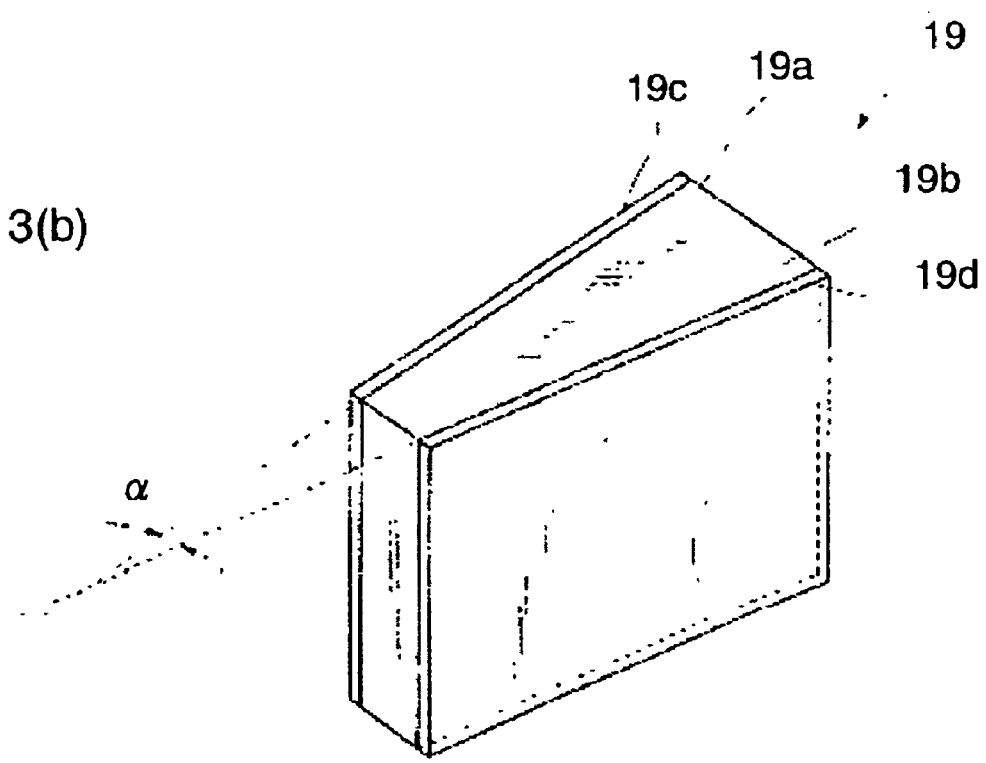

FIG. 3(b) shows another example of the etalon. This etalon has two films (19c, 19d) on respective surfaces (19a, 19b). Both films adjust the reflectivity at respective surfaces so that the periodic characteristic of the transmittance of the etalon may appear on the spectrum, which depends on the position X.

Figure 4A:
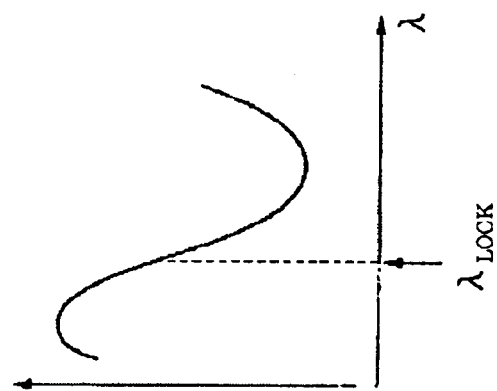
FIG. 4(*a*) is an exemplary diagram showing light signal not through the etalon device and FIG. 4(*b*) is a schematic diagram of an optical signal source for the WDM transmission using present optical module.
Figure 4B:
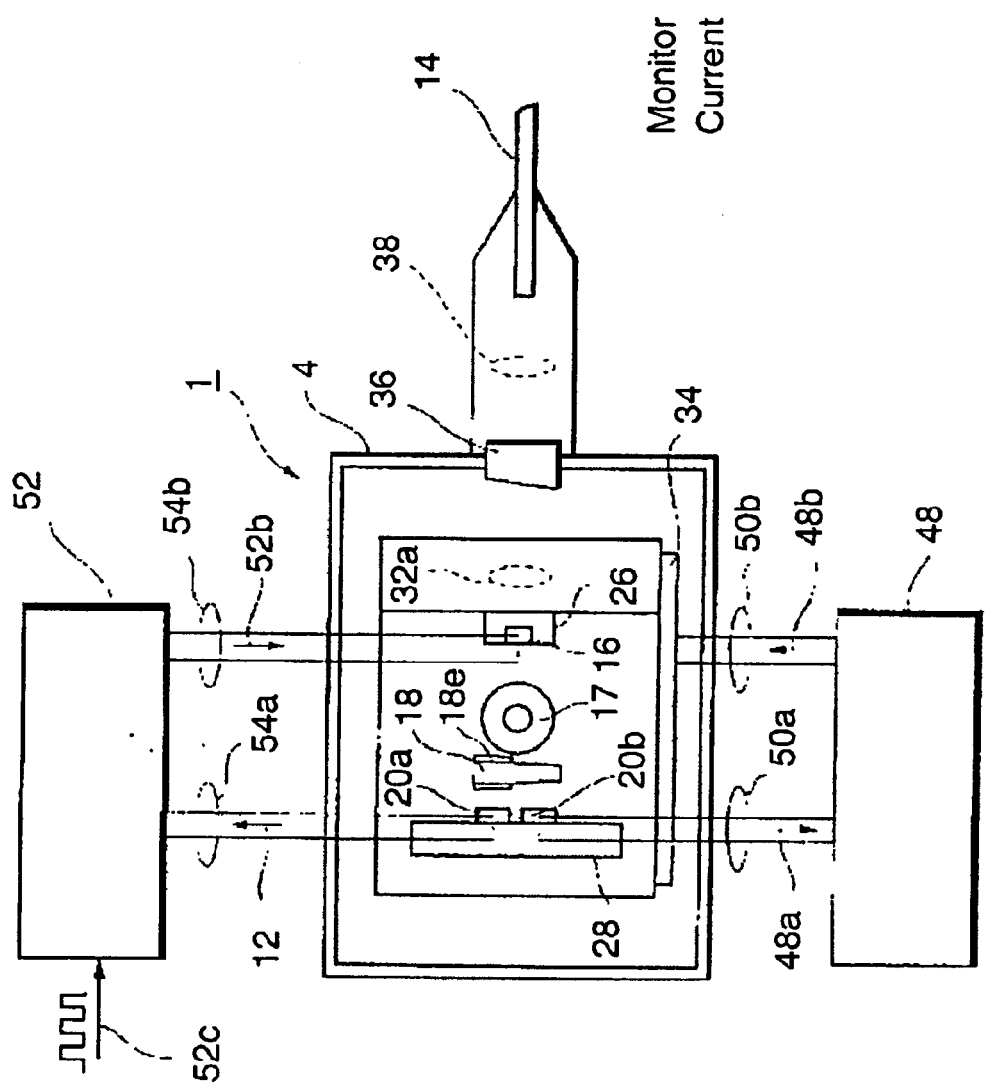

FIG. 4(a) shows a typical diagram obtained by the photo detector 20b. The horizontal axis denotes the wavelength of light emitted from the laser 16, while the vertical axis corresponds to the signal monitored by the detector 20b. FIG. 4(b) is a schematic diagram of a light source using the optical module of the present invention. The light source comprises a laser module 1, a first circuit block 48 for controlling the wavelength and a second circuit block 52 for controlling the optical power. The first block 48 couples to the detector 20b through the line 50a and also couples to the thermoelectric cooler 34 through the ling 50b. The first block receives the signal from the detector 20b and output the driving signal for the cooler 34. The temperature of the cooler is adjusted by the driving signal so as to compensate the wavelength shift of the emitting light, accordingly.

Namely, when the wavelength of the laser shifts to the shorter from $\lambda_{LOCK}$, the monitor current of the detector 20b increase. Responding the monitor current, the circuit 48 drives the cooler so that the laser 16 emits light with longer wavelength. When the wavelength shifts to longer side from the $\lambda_{LOCK}$, an reverse control may occur.

The second block 52 couples to the photo detector 20a through the ling 54a and the laser 16 through the line 54b. Receiving the monitored signal from the detector 20a, the block 52 drives the laser 16 so as to maintain the output power of the laser.

From FIG. 5 to FIG. 10 show various assemblies applicable to the present optical module.

(First Embodiment)

Figure 5A:
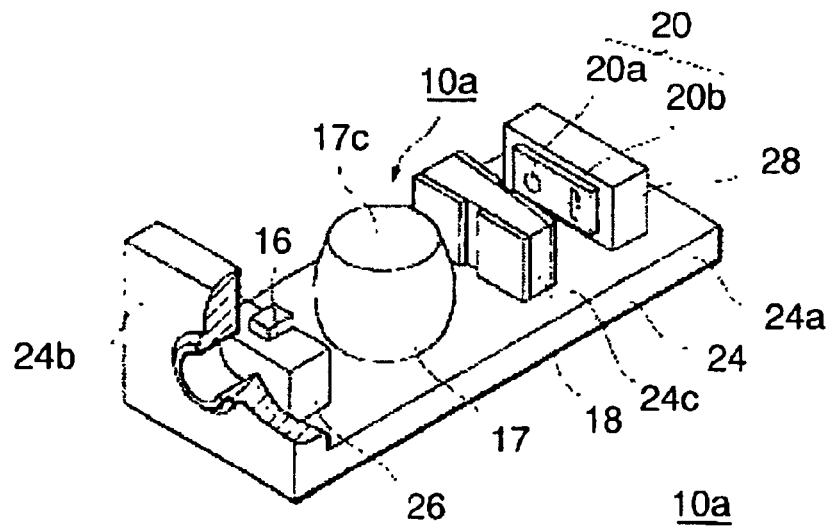
FIG. 5(*a*) is a perspective view showing an embodiment of the primary assembly, FIG. 5(*b*) is a side view and FIG. 5(*c*) is a plane view of the assembly showing in FIG. 5(*a*)
Figure 5B:
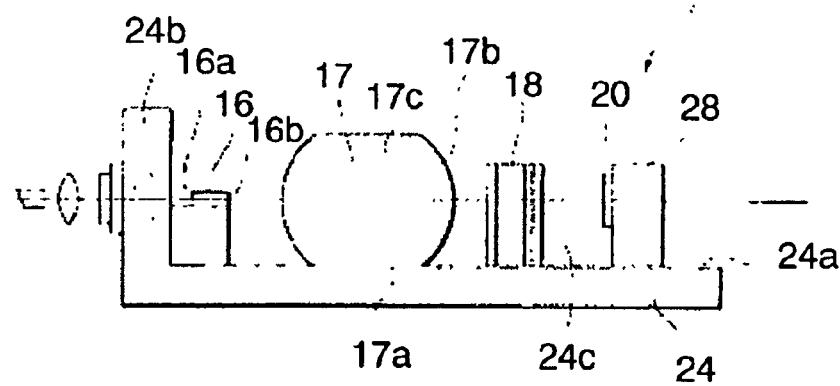

In FIGS. 5(a) and 5(b), the primary assembly 10a aligns the laser 16, the lens 17, the etalon 18, and the photo diode 20 along the predetermined axis on the surface 24c. This embodiment provides the etalon 18 of FIG. 3(a), in which light transmitting through the second portion 18y does not show the periodic characteristics. The lens shapes a flat bottom surface 17a, a flat top surface 17c, and curved side surface 17b. The top of the lens is cut to be flat so as not to enter light reflected by the etalon 18 into the laser 16, which results on a small sized package. Further, the flat bottom surface of the lens enables to assemble it directly on the auxiliary member 24a without any lens holder. The lens 32 and the lens holder 32a are not shown on the lens-supporting portion in FIG. 5(a)

Tow optical detectors 20a and 20b are arranged side by side on the photo diode 20. The detector 20a receives light transmitted through the second portion 18y of the etalon, while the second detector 20b receives light from the first portion 18x of the etalon. The width of the first detector 20a along the inclined direction of the etalon is larger than that of the second detector 20b. The width of the second detector 20b along a direction normal to the inclined direction is larger than the width along the inclined direction. By this configuration, the sensitivity for the wavelength variation and the magnitude of light are enhanced.

Figure 5C:
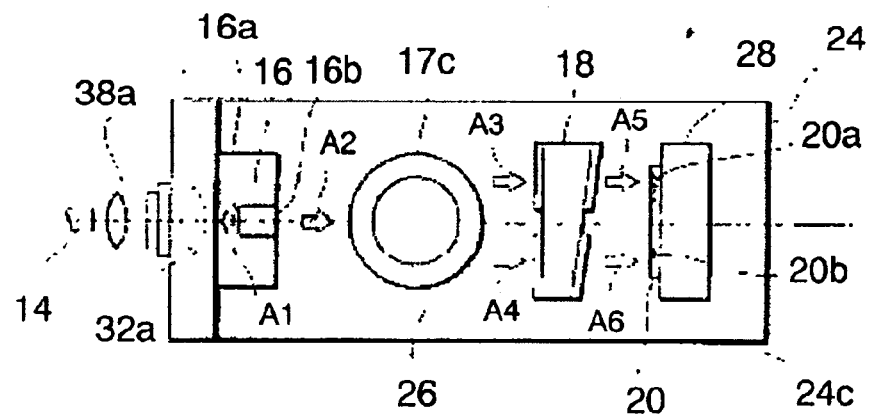

In FIG. 5(c), a light beam A1 enters the optical fiber 14 through two lenses 32a and 28a. Another beam A2, emitted from another facet 16b of the laser 16, enters the lens 17. The lens 17 generates two beams A3 and A4 collimated with each other. The beam A3 reaches the detector 20a through the second portion 18y, in which the periodic characteristics does not appear. In this configuration, beams A3 and A4 reflect the spectrum of the laser 16, and also the beam 6 reflects the optical properties of the etalon 18.

(Second Embodiment)

Figure 6A:
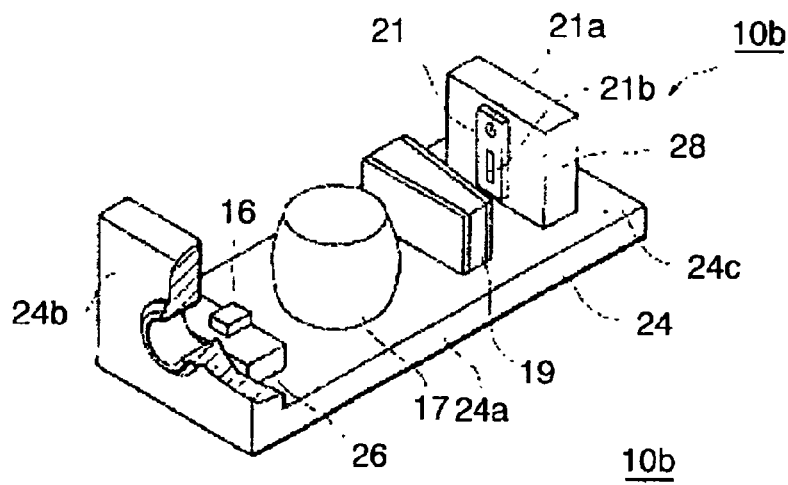
FIG. 6(*a*) is a view showing the second embodiment, FIG. 6(*b*) is a plane view and FIG. 6(*c*) is the side view of the embodiment of FIG. 6.
Figure 6B:
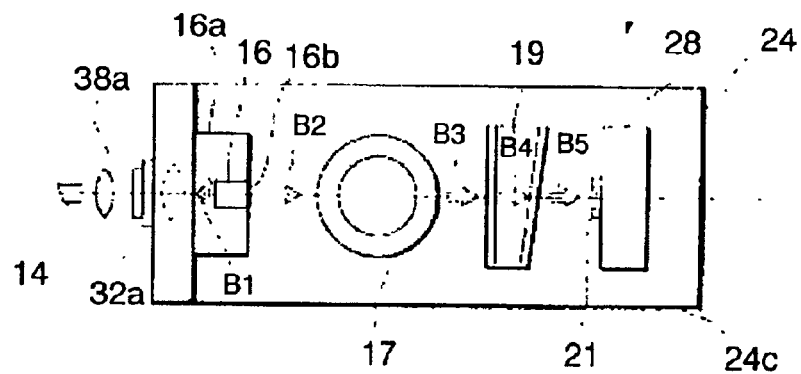
Figure 6C:
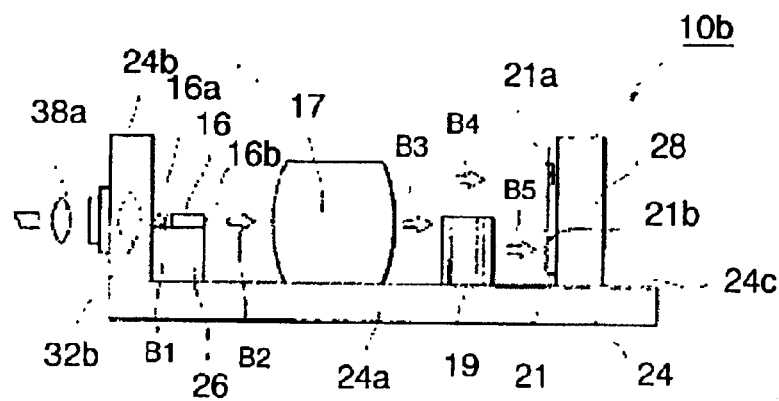

FIG. 6 shows the second embodiment of the invention, in which the etalon of FIG. 3(b) is applied. The primary assembly 10b has a photo diode 21 replaced from the photo diode 20 in the first embodiment. The assembly 10b aligns the laser 16, the lens 17, the etalon 19, and the photo diode 21 on the surface 24c along the predetermined axis. In this configuration, the detector 21a on the photo diode opposes the lens 17, while the detector 21b opposes the etalon 19.

Detectors 21a and 21b have an up-and-down arrangement. The detector 21a receives light passing over the etalon, while the detector 21b receives light passing through the etalon. The shape of respective detectors is same as the first embodiment. The height of the etalon 19 and the position of the first detector 21a are decided so that the detector 21a directly receives light from the lens 17. Further, the shape of lens 17 is also determined by the condition that the detector 21a directly receives light.

The light beam B1 from the facet 16 of the laser 16 enters the fiber 15 through a pair of lens 32b and 38a. Another beam B2 emitted from the facet 16b enters the lens 17. The lens 17 generates two collimated beams B3 and B4. The beam B4 directly enters the detector 21a without passing the etalon. The portion of the beam B3 enters the etalon and makes the beam B5 that reaches the detector 21b. The B4 involves the wavelength characteristic only of the laser 16, while the beam B5 reflects the characteristics both of the laser and the etalon.

(Third Embodiment)

Figure 7A:
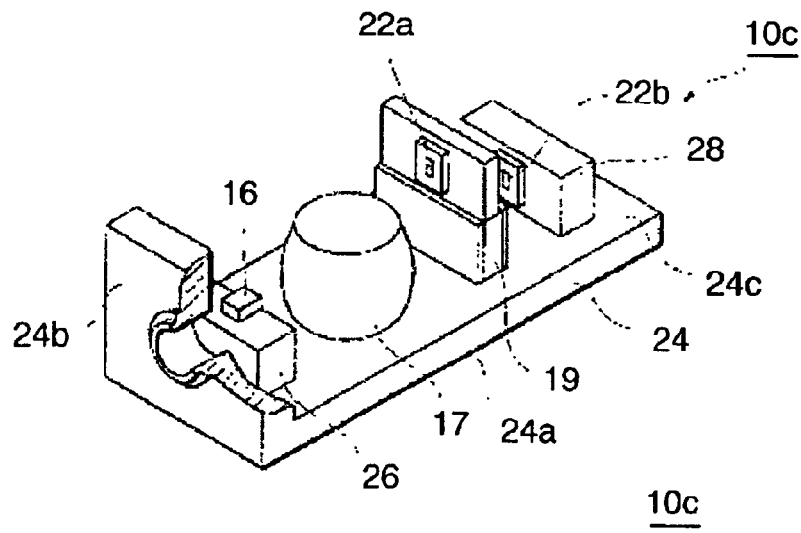
FIG. 7(*a*) is a view showing the third embodiment of the invention, FIG. 7(*b*) is a plan view and FIG. 7(*c*) is a side view of the embodiment.
Figure 7B:
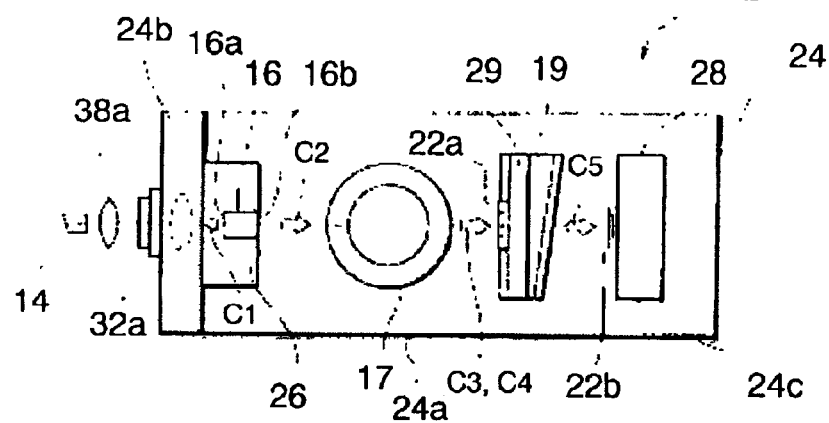
Figure 7C:
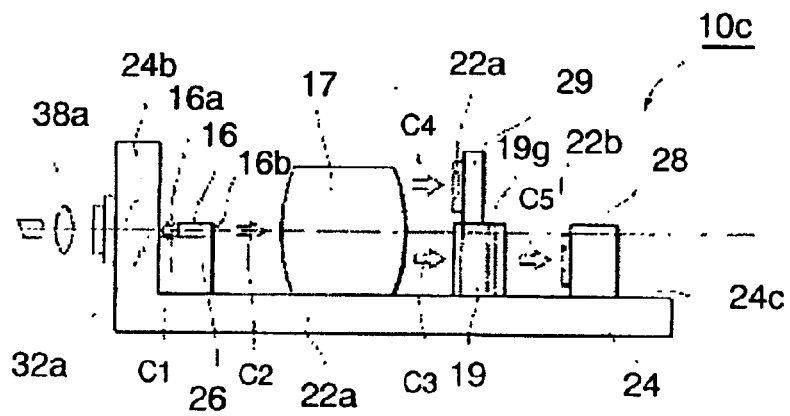

FIG. 7 shows the third embodiment of the invention. In this embodiment, the photo diode has detectors 22a and 22b instead of detectors appeared in previous embodiment. The primary assembly 10c aligns the laser 16, the lens 17, the etalon 19, and detectors (22a, 22b) on the surface 24c along the predetermined axis. In this configuration, the detector 22a faces the lens 17, while the detector 22b opposes the etalon 19. Two detectors 22a and 22b are independently to each other. The shape of the light sensitive region of respective detectors (22a, 22b) is same as the shape previously explained.

The etalon 19 has a flat top surface 19g to place the detector 22a thereon. This configuration, in which a distance from the laser to the detector 22a is shortened compared to the case in FIG. 6, enhances the magnitude of the received light. The size and its curvature of the lens 17 are determined by the condition that the detector 22a receives collimated light from the lens.

In this embodiment, a beam C1 emitted from the facet 16a enters the optical fiber 14 through two lenses 32a and 28a Another beam C2 emitted from the facet 16b enters the lens 17 and is converted to collimated beams C3 and C4. The beam C3 directly enters the detector 22a; therefore, the beam C3 only reflects the characteristic of the laser 16. On the other hand, since another beam C4 enters the detector 22b through the etalon 19, the output from the detector 22a involves the contribution of the laser 16 and the etalon 19.

(Fourth Embodiment)

Figure 8A:
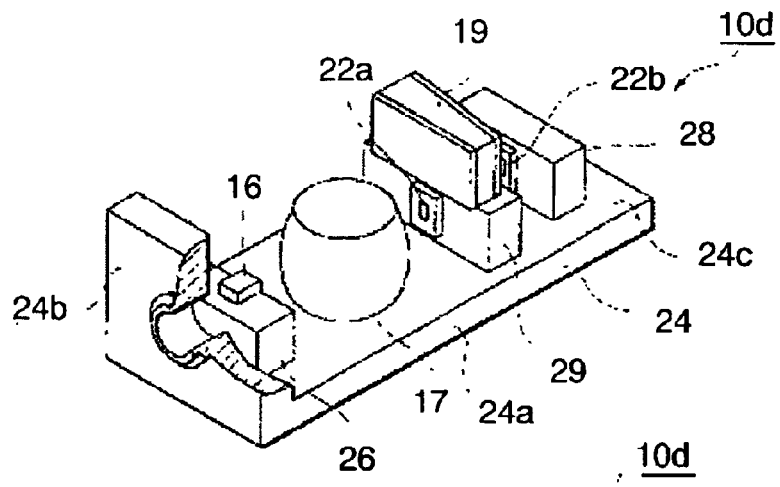
FIG. 8(*a*) shows a perspective view of the fourth embodiment, FIG. 8(*b*) is a plan view and FIG. 8(*c*) is a side view of the embodiment.
Figure 8B:
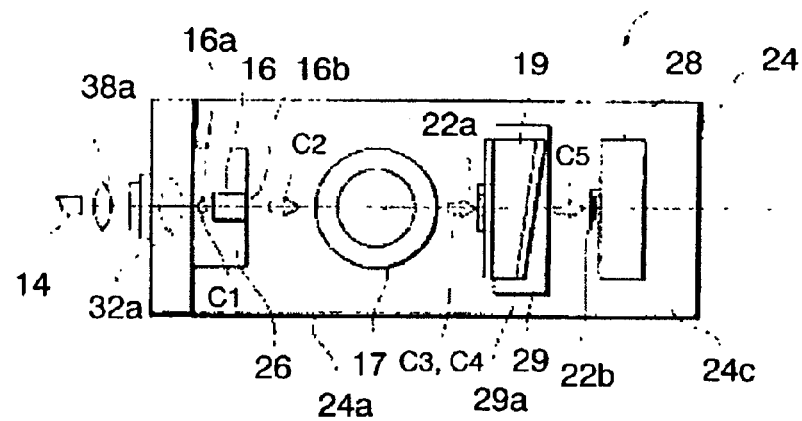
Figure 8C:
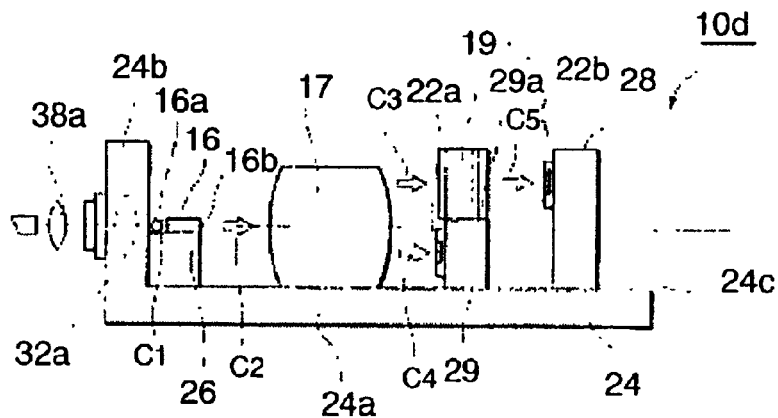

FIG. 8 shows the fourth embodiment of the invention. In this embodiment, the primary assembly contains a member 29 for mounting the etalon 19 thereon and for attaching the detector 22a thereto. To adjust the wavelength, to which the laser oscillation is fixed, is realized by sliding the etalon on the surface 29a of the member. Other compositions of the assembly are same with the case of the third embodiment.

(Fifth Embodiment)

Figure 9A:
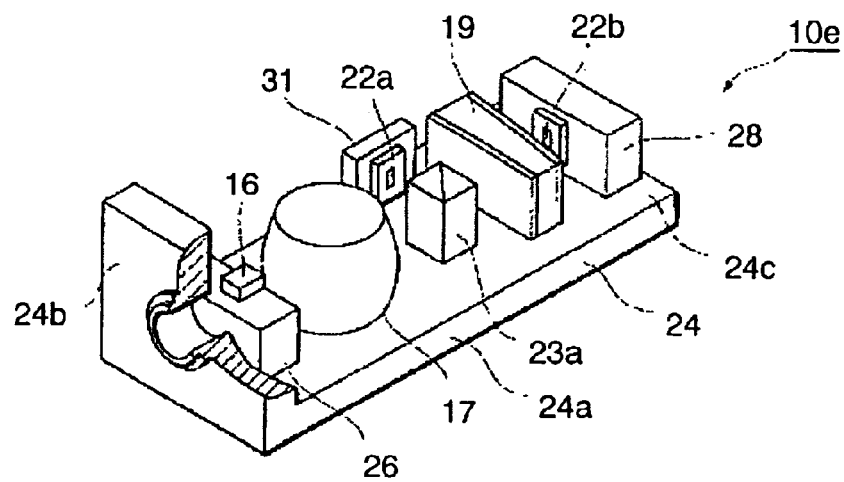
FIG. 9(*a*) is a perspective view of the fifth embodiment and FIG. 9(*b*) is a place view of the fifth embodiment.
Figure 9B:
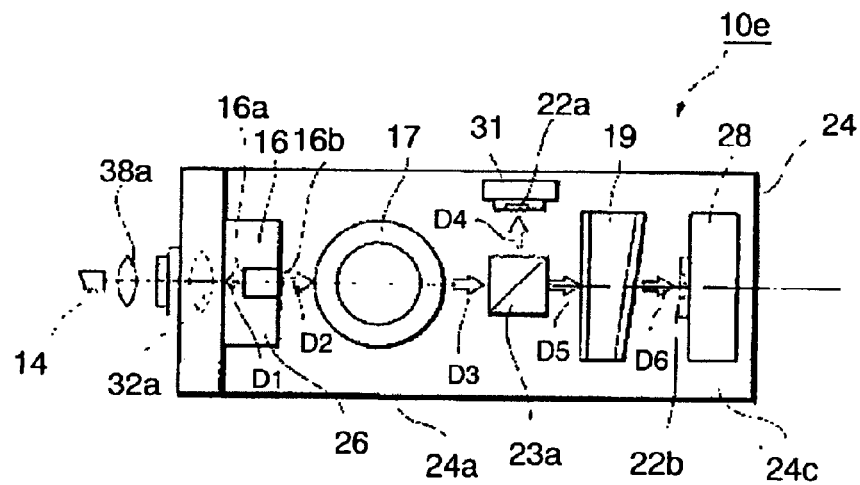

FIG. 9 shows the fifth embodiment of the invention. This embodiment contains the laser 16, the lens 17, the beam splitter 23a, the etalon, and two detectors (22a, 22b) on the auxiliary member 24. The beam splitter 23a optically couples to the lens and the detector 22a attached to another member 31. Light from the splitter 23a reaches the detector 22b through the etalon 19.

In this arrangement, a beam D1 emitted from the facet 16 enters the optical fiber 14 through two lenses 32a and 38a. Another beam D2 emitted from the facet 18b enters the lens 17 and is converted to collimated beam D3 by the lens. The splitter 23a divides the collimated beam D3 into two beams D4 and D5. The beam reaches the detector 22a without passing through the etalon, so the beam reflects the spectrum only of the laser 16. On the other hand, one of the divided beams D5 reaches the detector 22b through the etalon, so the output from the detector 22b contains the spectrum both of the laser 16 and the etalon 19.

(Sixth Embodiment)

Embodiments previously described utilize light emitted from the facet 16b of the laser to control the wavelength and the output power of the laser. Another example will be explained in which light from the front facet 16b of the laser is referred for the control.

Figure 10A:
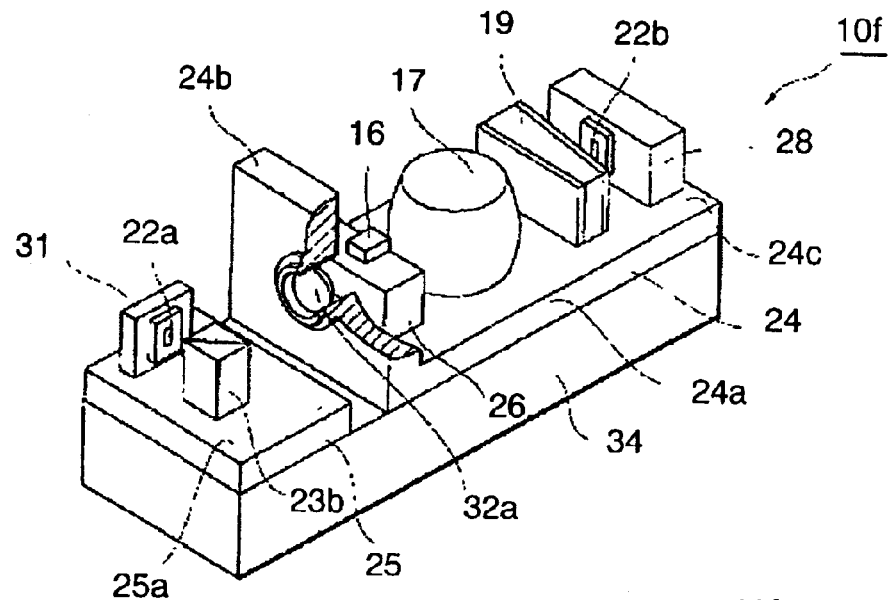
FIG. 10(*a*) shows a perspective view of the sixth embodiment, and FIG. 10(*b*) is a plane view.
Figure 10B:
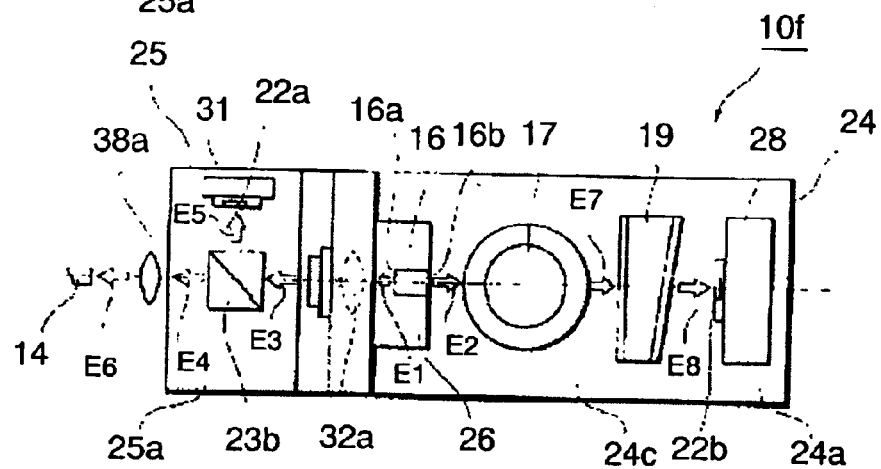

In FIG. 10, the primary assembly of the module contains the detector 22a on the front side of the laser 16 and the detector 22b on the backside of the laser. The thermoelectric cooler 34 place an auxiliary member 24 and another member 25 thereon. The laser 15, the lens 17, the etalon, and detector 22b are mounted on the auxiliary member 24. The splitter 23b and the detector 22a are mounted on the member 25. The splitter 23b optically couples to the laser 16 through the lens 32a, the fiber 14, and the detector 22a. The back facet 16b of the laser optically couples to the detector 22a through the etalon 19.

A light beam E1 emitted from the facet 16a enters the splitter through the lens 32a. The splitter 23b divides the beam E1 into two beams E4 and E5. The beam E5 enters the detector 22a, in which only the spectrum of the laser is contained. Another beam E4 enters the fiber 14 through the lens 38a. On the other hand, the beam E2 emitted from the back facet 16b enters the lens 17 and is converted into the collimated beam E7. The beam E7 reaches the detector 22b through the etalon; therefore, the output from the detector 22b contains the spectrum both of the laser and the etalon.

Since various embodiments previously mentioned use a wedge type etalon not a parallel-plate type etalon for the wavelength discriminate device, it enables to reduce a region to place the etalon. In the parallel-plate etalon, a free spectral rang, which means a period appeared in the transmittance spectrum, is determined by an angle of incident light. Since the free spectral range closely relates to the wavelength interval, it is inevitable to rotate the etalon for adjusting the free spectral range and to obtain a desired wavelength interval. Therefore, it requires for the etalon to rotate in the case of the parallel plate type. On the other hand, only sliding adjusts the wavelength in the wedge type etalon.

From the invention thus described, it will be obvious that the invention may be varied in many ways. Although various types of auxiliary member are described, other combination of members are considered to be within the scope of the present invention. The present invention is not restricted to the L-shaped member. Further, the light-receiving device may integrally contain two detectors or may be discrete device independently to each other. Such variations are not to be regarded as a departure from the spirit and scope of the invention, and all such modifications as would be obvious to one skilled in the art are intended for inclusion within the scope of the following claims.

What is claimed is:

1. A light-emitting module comprising:

a semiconductor light-emitting device for emitting light of a predetermined magnitude under a predetermined temperature;

a first optical detector for outputting a first output, said first optical detector optically coupling to said semiconductor light-emitting device;

a second optical detector for outputting a second output, said second optical detector optically coupling to said semiconductor light-emitting device; and an etalon device having a first surface for optically coupling to said semiconductor light-emitting device and a second surface for optically coupling to said first optical detector and said second detector, said etalon device having a first portion with a first axis connecting said semiconductor light-emitting device to said first optical detector and a second portion with a second axis connecting said semiconductor device to said second detector, wherein said first surface of said second portion and said second surface of said second portion of said etalon device have an anti-reflection coating.

2. The light-emitting module according to claim 1, further comprising a lens provided between said semiconductor light-emitting device and said etalon device for collimating said light emitted from said semiconductor light-emitting device.

3. The light-emitting module according to claim 1, wherein said first optical detector and said second optical detector are formed integrally.

4. The light-emitting module according to claim 1, further comprising a thermoelectric cooler for controlling said predetermined temperature of said semiconductor light-emitting device by said second output from said first optical detector.

5. The light-emitting module according to claim 1, wherein said predetermined magnitude of said semiconductor light-emitting device is controlled by said second output from said second optical detector.

6. An optical signal source for Wavelength Division Multiplexing communication, comprising:

a semiconductor laser for emitting light with a wavelength λ and a predetermined magnitude under a predetermined temperature;

a first optical detector for outputting a first output;

a second optical detector for outputting a second output;

a wedge type etalon device placed between the semiconductor laser and the first detector and second optical detector, said wedge type etalon device having a first portion with a first axis connecting the semiconductor laser to the first detector and a second portion connecting the semiconductor laser and the second optical detector;

a lens provided between the semiconductor laser and the wedge type etalon device for collimating said light emitted from the semiconductor laser;

a Peltier element for adjusting the predetermined temperature of the semiconductor laser;

a temperature controlling circuit for receiving the first output from the first optical detector and for driving the Peltier element; and an optical output controlling circuit for receiving the second output from the second optical detector and for controlling the magnitude of the light emitted from the semiconductor laser, wherein the second portion of the wedge type etalon device has an antireflection coating.

7. The optical signal source according to claim 6, wherein the first and second optical detectors are formed integrally.

8. A light-emitting module, comprising:

a semiconductor light-emitting device for emitting light with a predetermined magnitude under a temperature;

a first optical detector for outputting a first signal;

a second optical detector for outputting a second signal;

a wedge type etalon device having a first surface optically coupled to the semiconductor light-emitting device and a second surface optically coupled to the first and second optical detectors, the wedge type etalon device having a first portion with a first axis connecting the semiconductor light-emitting device and the first optical detector and a second portion with a second axis connecting the semiconductor light-emitting device and the second optical detector, wherein the first and second surfaces of the second portion of the wedge type etalon device have an anti-reflecting coating.

9. The light-emitting module according to claim 8, further comprising a lens provided between the semiconductor light-emitting device and the wedge type Etalon device for collimating the light emitted from the semiconductor light-emitting device.

10. The light-emitting module according to claim 8, wherein the first and the second detectors are formed integrally.

11. The light-emitting module according to claim 8, further comprising a thermoelectric cooler for controlling the temperature of the semiconductor light-emitting device by the first signal output from the first optical detector.

12. The light-emitting module according to claim 8, wherein the predetermined magnitude of the light emitted from the light-emitting semiconductor device is controlled by the second signal output from the second optical detector.

* * * * *